United States Patent
Lin et al.

(10) Patent No.: US 7,307,296 B2
(45) Date of Patent: Dec. 11, 2007

(54) FLASH MEMORY AND FABRICATION METHOD THEREOF

(75) Inventors: Hsin-Fu Lin, Hsinchu (TW); Chun-Pei Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/157,303

(22) Filed: Jun. 20, 2005

(65) Prior Publication Data
US 2006/0284267 A1    Dec. 21, 2006

(51) Int. Cl.
*H01L 27/10* (2006.01)
(52) U.S. Cl. .................. 257/208; 257/315; 257/390; 257/391; 257/E29.309
(58) Field of Classification Search .................. 257/208
See application file for complete search history.

(56) References Cited

U.S. PATENT DOCUMENTS

| | | | |
|---|---|---|---|
| 6,624,024 B1 * | 9/2003 | Prall et al. | 438/257 |
| 6,765,528 B2 | 7/2004 | Wu | 257/315 |
| 6,984,559 B2 * | 1/2006 | Wang et al. | 438/257 |
| 2005/0056895 A1 * | 3/2005 | Shimizu et al. | 257/355 |

OTHER PUBLICATIONS

Peter Van Zant, Microchip Fabrication, 2000, McGraw-Hill, Fourth Edition, pp. 372,404,405.*

* cited by examiner

*Primary Examiner*—Minhloan Tran
*Assistant Examiner*—Eduardo A. Rodela
(74) *Attorney, Agent, or Firm*—J.C. Patents

(57) ABSTRACT

A flash memory comprises a substrate, control gates, doped regions, an isolation layer, isolation structures, floating gates, tunneling dielectric layers and inter-gate dielectric layers. The control gates are arranged over the substrate with a first direction, and the doped regions are arranged within the substrate with a second direction. The isolation layers are disposed between the control gates and the doping regions, and the isolation structures are disposed within the substrate where the doped regions and the control gates do not overlap. Furthermore, the floating gates are disposed between the control gates and the substrate that is not covered by the isolation layers. The tunneling dielectric layers are disposed between the substrate and the floating gates. The inter-gate dielectric layers are disposed between the control gates and the floating gates.

7 Claims, 10 Drawing Sheets

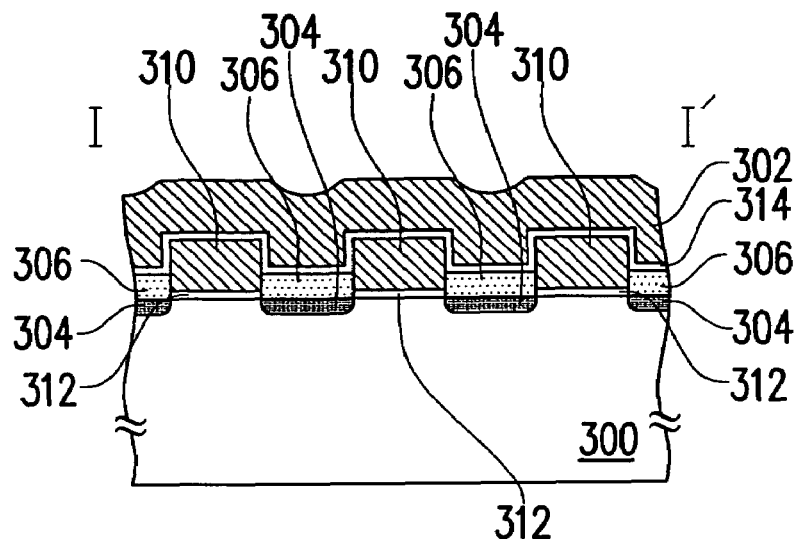
FIG. 4-I
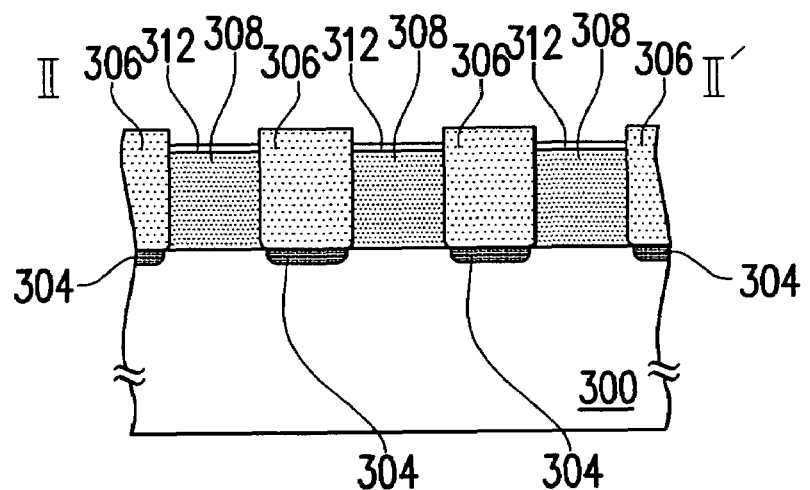
FIG. 4-II
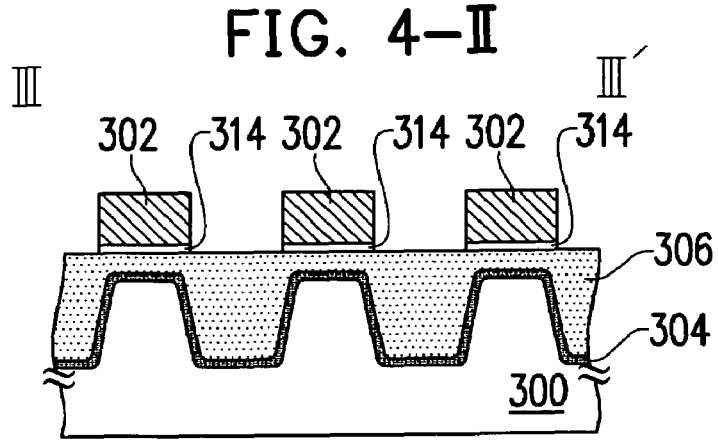
FIG. 4-III

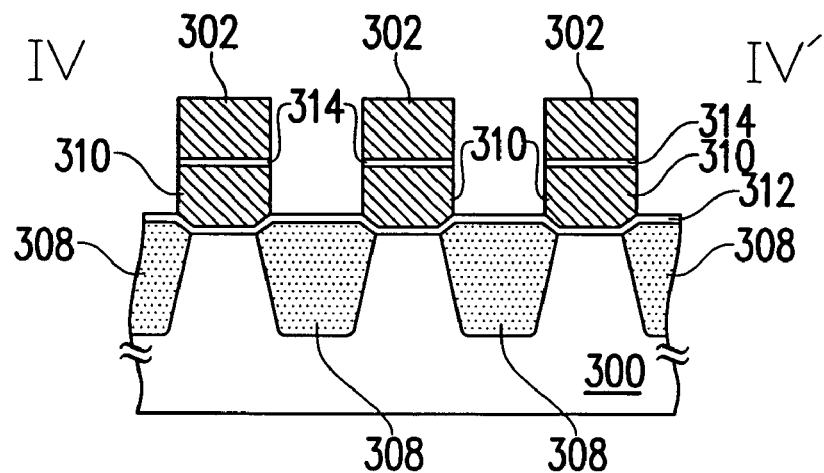
FIG. 4-IV
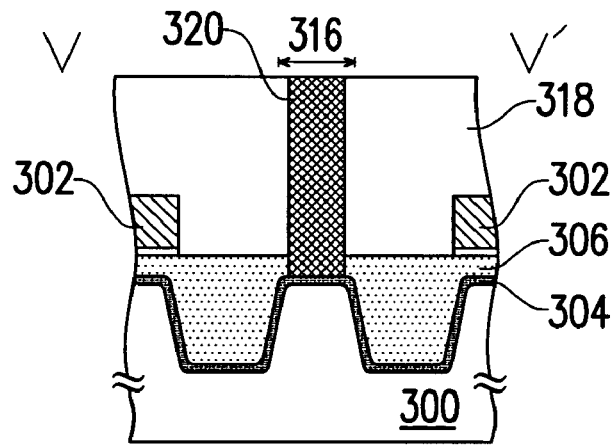
FIG. 4-V
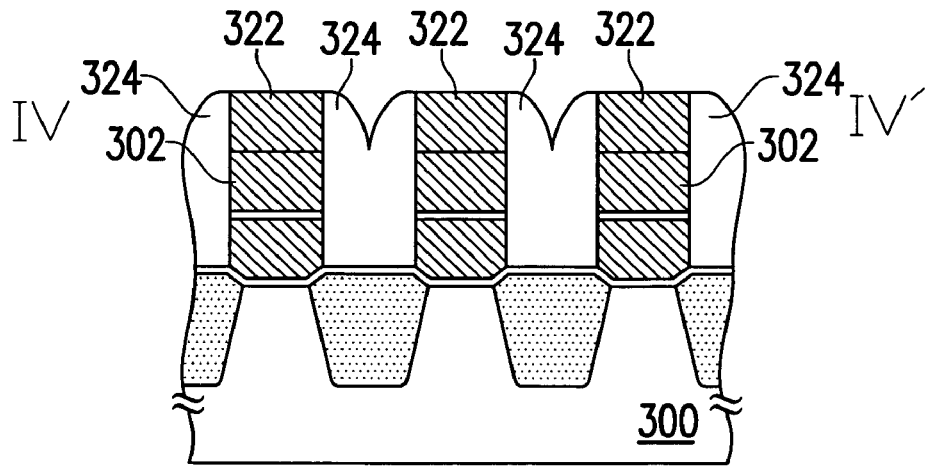
FIG. 5-IV

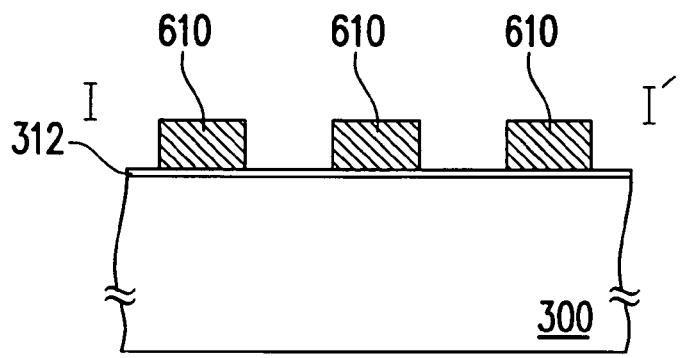
FIG. 6A-I
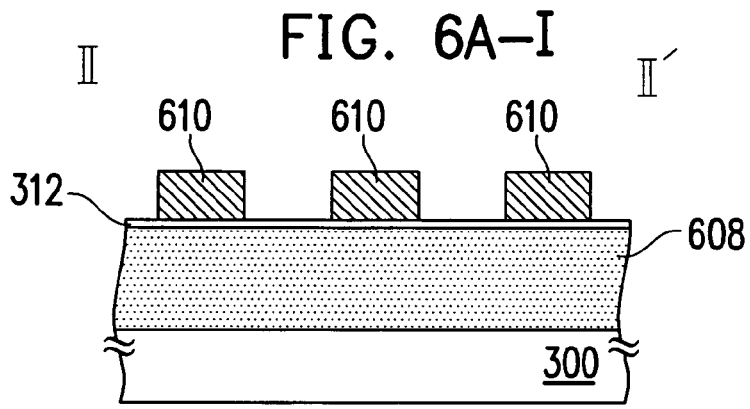
FIG. 6A-II
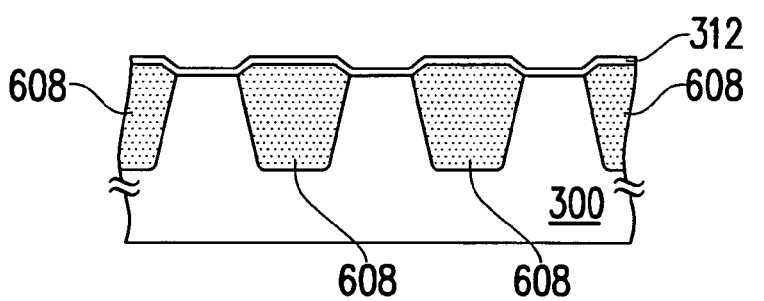
FIG. 6A-III
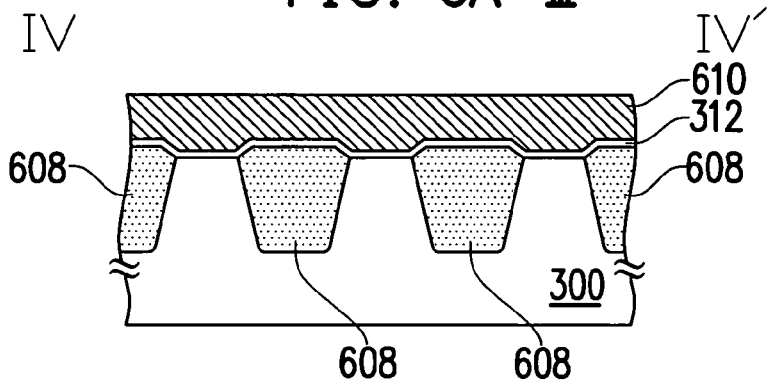
FIG. 6A-IV

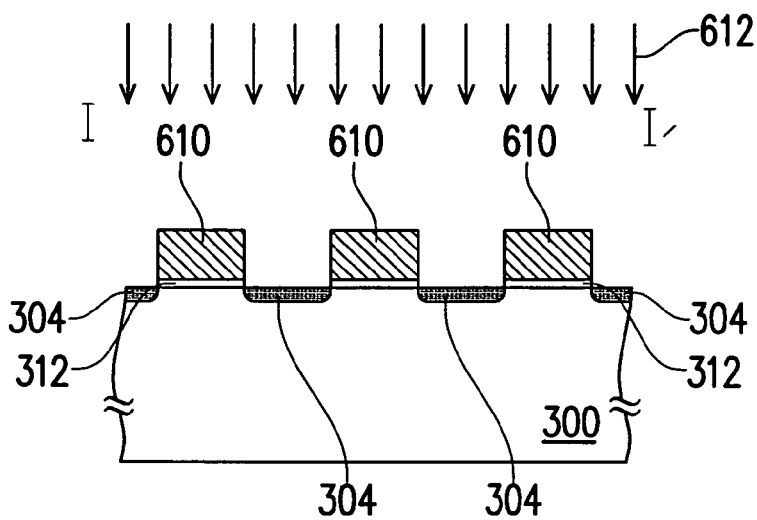
FIG. 6B-I
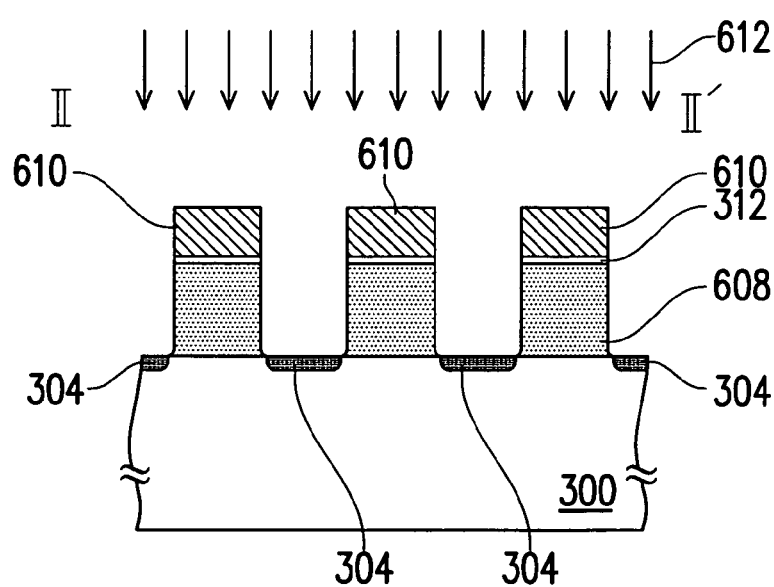
FIG. 6B-II
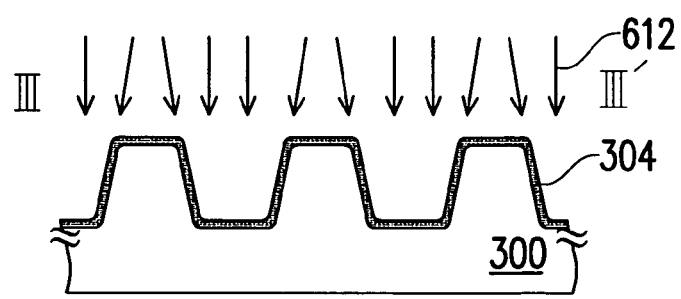
FIG. 6B-III

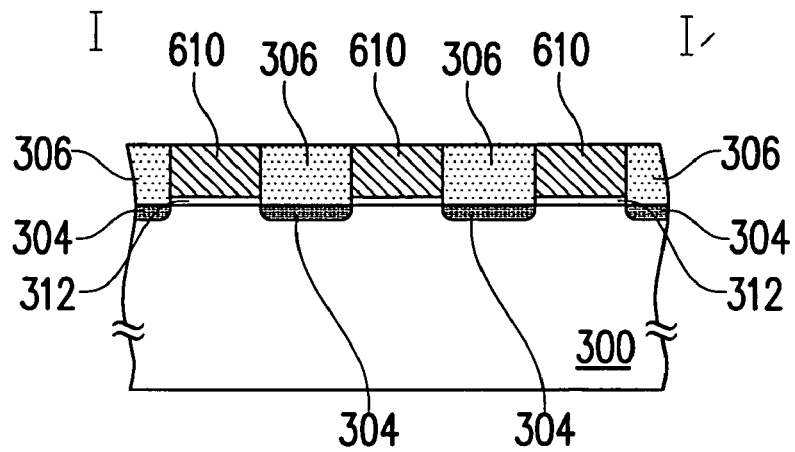
FIG. 6C-I
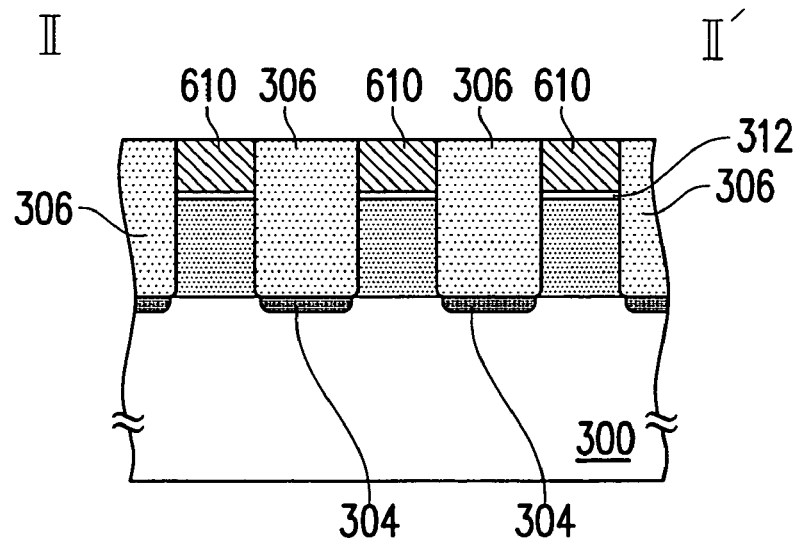
FIG. 6C-II
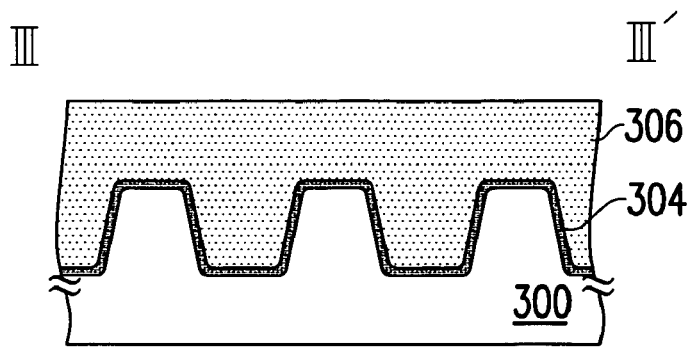
FIG. 6C-III

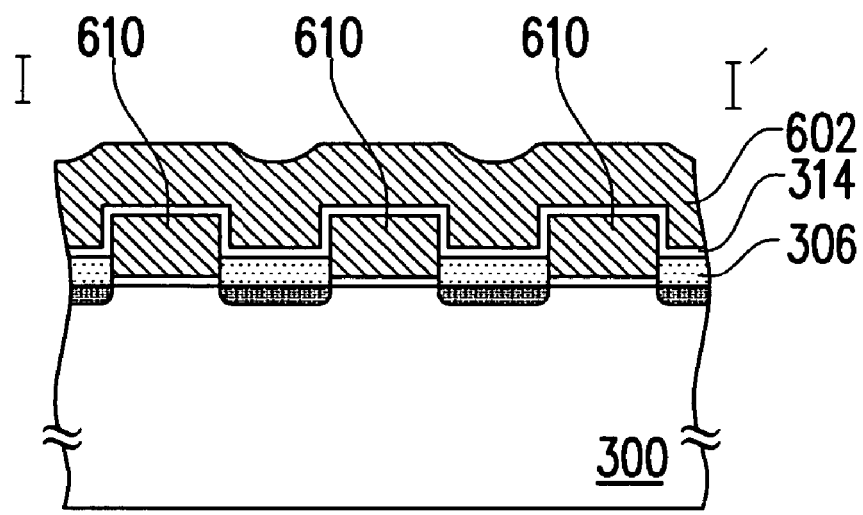
FIG. 6D-I
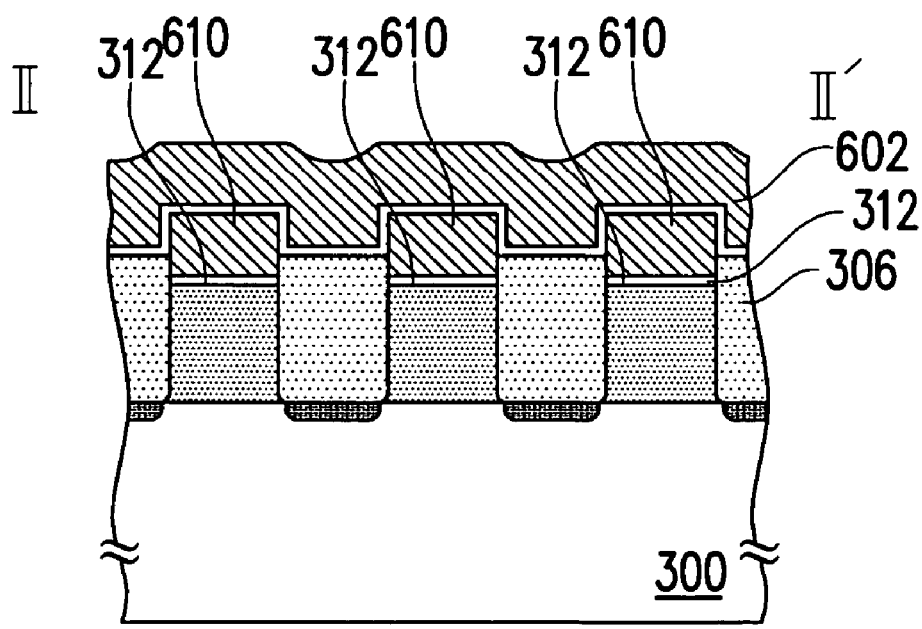
FIG. 6D-II

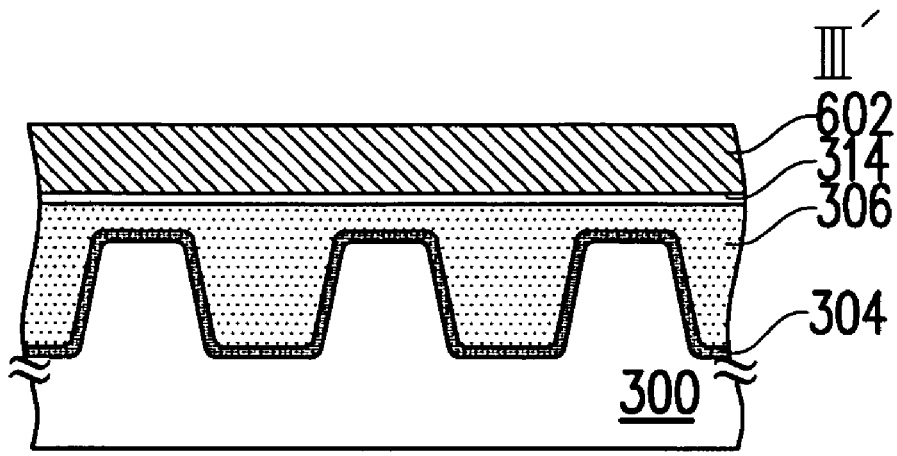
FIG. 6D-III
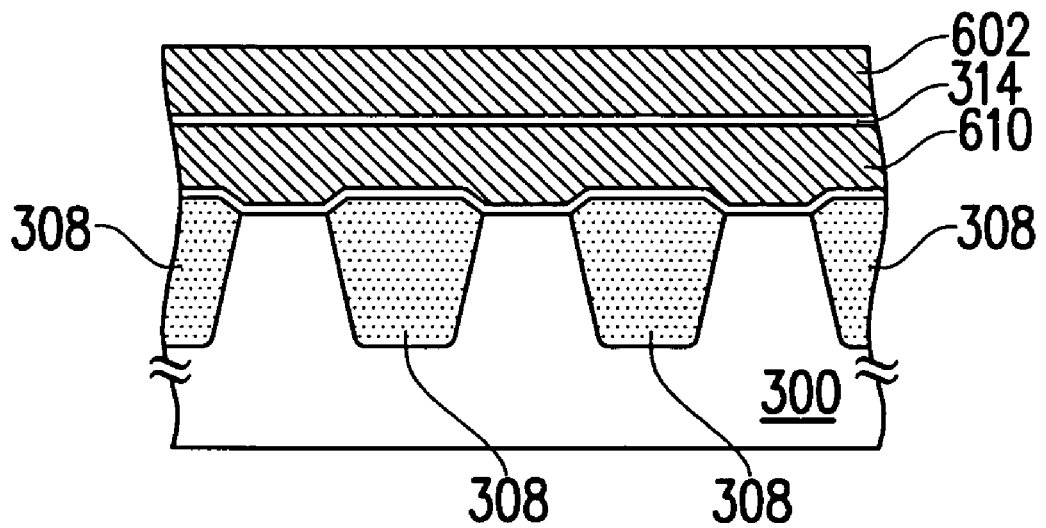
FIG. 6D-IV

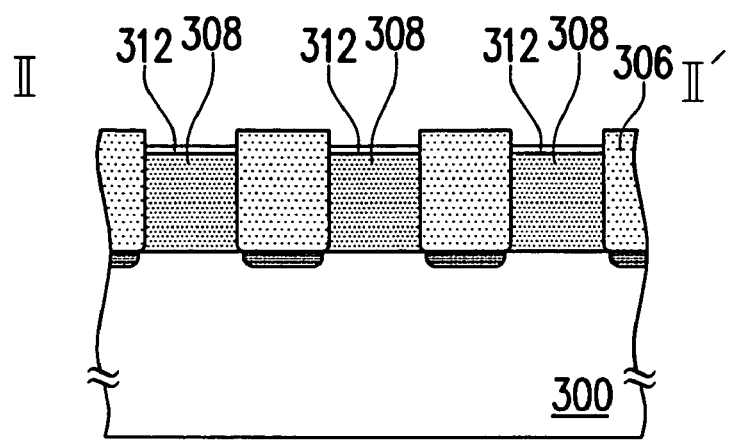
FIG. 6E-II
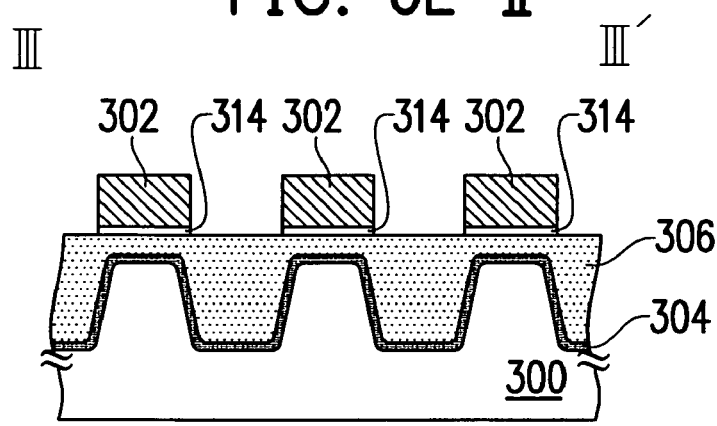
FIG. 6E-III
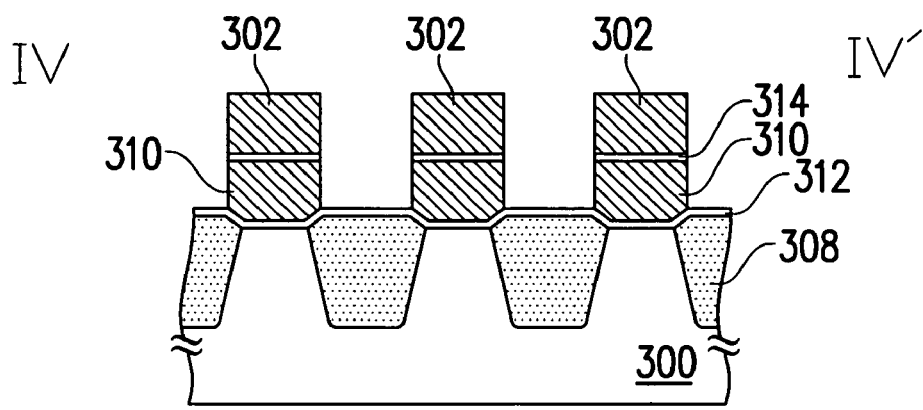
FIG. 6E-IV

FLASH MEMORY AND FABRICATION METHOD THEREOF

BACKGROUND OF THE INVENTION

1. Field of the Invention

The present invention relates to a flash memory, and more particularly, to a flash memory and its fabrication method.

2. Description of the Related Art

Since a flash memory can store, read or erase data at multiple times, even if power is cut off, the data stored in the memory will not be erased. Accordingly, it becomes a widely adopted non-volatile memory device in the fields of personal computers and electronic apparatuses.

FIG. 1 is a top view of a prior art flash memory. FIG. 2 is a cross sectional view of the structure along II-II' in FIG. 1.

Referring to FIGS. 1 and 2, the active regions 102 and the isolation structures 104 are alternately disposed within the substrate 100 with the y direction. The control gates 106 are arranged over the substrate 100 with the x direction. The floating gates (not shown) of the memory cell and the tunneling dielectric layers (not shown) are disposed at the regions 110 between the active regions 102 and the control gates 106 which overlap. In addition, the active region 102, which is adjacent to one side of the control gate 106, serves as the source 108a; and the other side of the active region 102 serves as the drain 108b. Usually, the drains 108b on the same column connect with a conductive line (not shown) through the contacts 112. For the sources 108a shown in FIG. 2, the isolation structures 104 of the sources 108a are removed first. The doped regions 114 then are formed within the exposed substrate 100, connecting with sources 108a of the same column. The sources 108a are electrically coupled to a conductive line (not shown) through the source pickup line 116 between two isolation structures 104 and the contacts 118.

The structure described above, however, requires so many contacts that many contact areas for connecting with the drains should be reserved while the array structure is designed. As a result, the area of the flash memory cannot further shrink. It is an obstacle in reducing the dimension of the semiconductor memory.

SUMMARY OF THE INVENTION

Accordingly, the present invention is directed to a flash memory to further reduce the array area. Meanwhile, each signal in the memory can be transmitted with the same distance.

The present invention also is directed to a method of fabricating a flash memory. This method is compatible with the traditional process. Without additional process steps, the novel flash memory of the present invention can be fabricated.

The present invention provides a flash memory, which comprises a substrate, plural strips of control gates, plural strips of doped regions (source/drain doped regions), an isolation layer, a plurality of isolation structures, a plurality of floating gates, a plurality of tunneling dielectric layers and a plurality of inter-gate dielectric layers. Wherein, the control gates are arranged over the substrate with a first direction. The doped regions are arranged within the substrate with a second direction. Moreover, the isolation layer is disposed between the control gates and the doped regions. The isolation structures are disposed within the substrate where the doped regions and the control gate do not overlap. The floating gates are disposed between the control gates and the substrate not covered by the isolation layer. The tunneling dielectric layers are disposed between the substrate and the floating gates. The inter-gate dielectric layers are disposed between the control gates and the floating gates.

According to an embodiment of the present invention, the flash memory further comprises a plurality of source/drain connection regions, each of them being disposed between two control gates; and a plurality of contacts, each contact being connected with one of the doped regions within the source/drain connection regions.

According to the flash memory of an embodiment of the present invention, the control gates and the floating gates described above comprise polysilicon layers, and the material of the inter-gate dielectric layers described above comprises oxide-nitride-oxide. The isolation layer described above comprises a high-density plasma (HDP) material layer.

According to the flash memory of an embodiment of the present invention, it further comprises a silicide layer disposed on the top of the control gates. In addition, a plurality of spacers is disposed on the sidewalls of the control gates and the floating gates.

The present invention also provides a method of fabricating a flash memory. According to the method, plural strips of trench structures with a first direction are formed within a substrate. A tunneling dielectric layer is formed over the substrate. Plural strips first conductive layers with a second direction are formed over the tunneling dielectric layer and the first conductive layers cross over the trench structures. The tunneling dielectric layer between the first conductive layers then is removed to expose a portion of the trench structures. The exposed trench structures are further removed to expose the substrate at the bottom of the trench structures. An ion implantation process is performed to form a plurality of doped regions within the exposed substrate between the first conductive layers. An isolation layer is filled between the first conductive layers to expose the top of the first conductive layers. An inter-gate dielectric layer is formed over the substrate to cover the first conductive layers. A second conductive layer is formed over the inter-gate dielectric layer. The second conductive layer is patterned to form plural strips of control gates with the first direction. The inter-gate dielectric layer and the first conductive layers thereunder are removed by using the control gates as a mask so to form a plurality of floating gates.

According to the method of fabricating the flash memory of an embodiment of the present invention, the step of forming the first conductive layers comprises: a first polysilicon layer is deposited over the substrate; a patterned silicon nitride layer is formed over the first polysilicon layer; the exposed first polysilicon layer is then patterned and removed by using the patterned silicon nitride layer as a mask. Moreover, the patterned silicon nitride layer can be removed after the isolation layer has been filled in the first conductive layers.

According to the method of fabricating the flash memory of an embodiment of the present invention, the step of filling the isolation layer between the first conductive layers comprises: a dielectric layer is formed over the substrate by a high-density plasma process, and the dielectric layer is removed by a chemical-mechanical polish (CMP) process until the top of the first conductive layers is exposed. Then, it is optional to remove a portion of the high-density plasma material layer so that the top of the high-density plasma material layer is higher than the top of the first conductive layers to enhance the gate coupling ratio (GCR).

According to the method of fabricating the flash memory of an embodiment of the present invention, the step of forming the second conductive layer comprises forming a second polysilicon layer.

According to the method of fabricating the flash memory of an embodiment of the present invention, it further comprises forming a silicide layer over the control gates after forming the floating gates. Additionally, a plurality of spacers on sidewalls of the control gates and the floating gates may be disposed after forming the floating gates.

According to the method of fabricating the flash memory of an embodiment of the present invention, after forming the floating gates, a plurality of contacts connecting with the doped regions may be formed.

According to the present invention, the flash memory has the control gates and the doped regions, which are alternately disposed. As a result, the contact areas connected to the drain areas are reduced, and the whole array areas shrink as well. Additionally, signals can be transmitted with the same distance. In addition, the fabrication method of the present invention is compatible with the traditional process. Without additional processes, the flash memory of the present invention can be fabricated.

The above and other features of the present invention will be better understood from the following detailed description of the preferred embodiments of the invention that is provided in communication with the accompanying drawings.

BRIEF DESCRIPTION OF THE DRAWINGS

FIGS. 4-I, 4-II, 4-III, 4-IV and 4-V are cross sectional views of the flash memory along I-I', II-II', III-III', IV-IV' and V-V', respectively.

FIG. 5-IV shows another structure related to the structure of FIG. 4-IV.

FIGS. 6A-I-6D-I are cross sectional views of process of fabricating the structure of FIG. 3 along I-I'.

FIGS. 6A-II-6E-II are cross sectional views of process of fabricating the structure of FIG. 3 along II-II'.

FIGS. 6A-III-6E-III are cross sectional views of process of fabricating the structure of FIG. 3 along III-III'.

FIGS. 6A-IV-6E-IV are cross sectional views of process of fabricating the structure of FIG. 3 along IV-IV'.

DESCRIPTION OF THE PREFERRED EMBODIMENTS

First Embodiment

Figure 1:
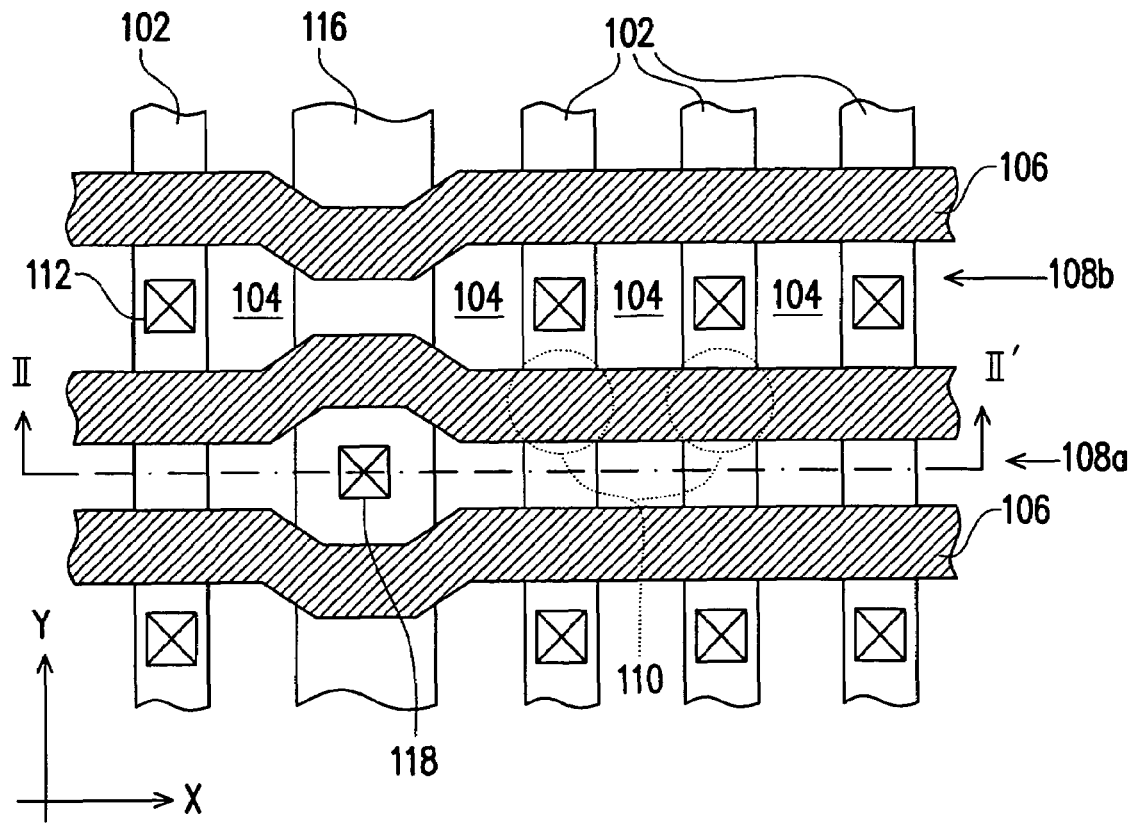
FIG. 1 is a top view of a prior art flash memory.
Figure 2:
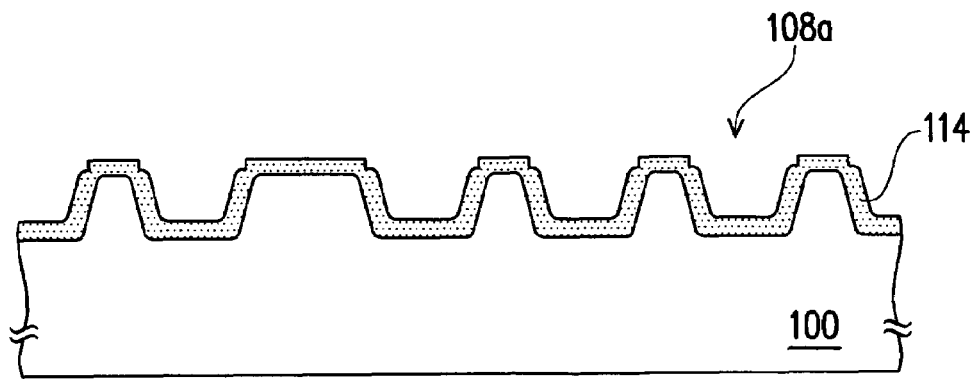
FIG. 2 is a cross sectional view of the structure along II-II' in FIG. 1.
Figure 3:
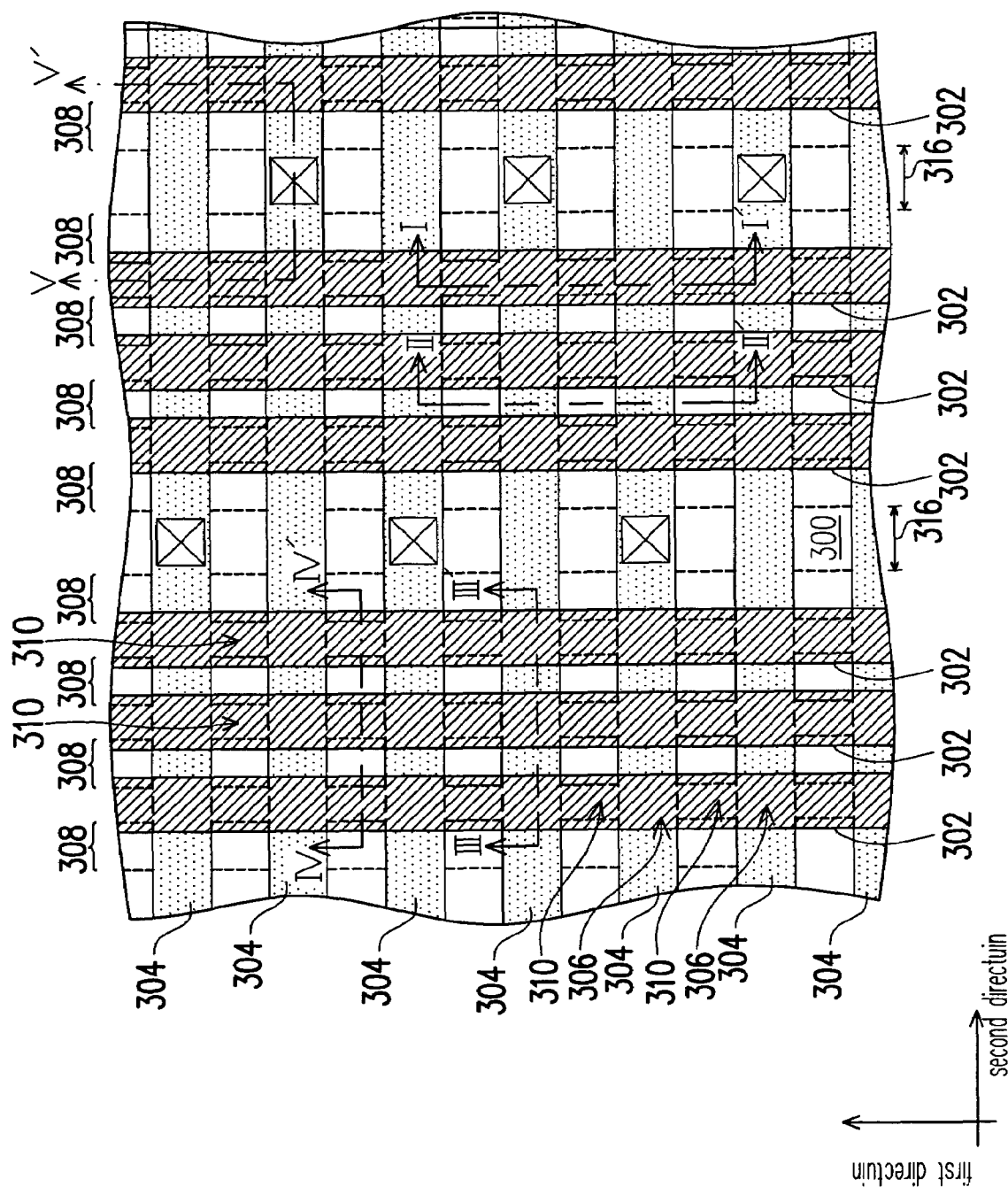
FIG. 3 is a top view of a flash memory according to the first embodiment, of the present invention.

FIG. 3 is a top view of a flash memory according to the first embodiment of the present invention. FIGS. 4-I, 4-II, 4-III, and 4-IV are cross sectional views of the flash memory along I-I', II-II', III-III', and IV-IV', respectively.

Referring to FIGS. 3, 4-I, 4-II, 4-III, and 4-IV, the flash memory comprises the substrate 300, plural strips of control gates 302, a plurality of doped regions 304, the isolation layer 306, a plurality of isolation structures 308, a plurality of floating gates 310, a plurality of tunneling dielectric layers 312 and a plurality of inter-gate dielectric layers 314. Wherein, the control gates 302 are arranged with a first direction over the substrate 300. The doped regions 304 are arranged within the substrate with a second direction within the substrate 300. In the flash memory of this embodiment, the doped regions 304 serve as sources and drains. Moreover, the isolation layer 306 is disposed between the control gates 302 and the doped regions 304. The isolation layer 306 can be, for example, a high-density plasma (HDP) material layer. The isolation structures 308 are disposed within the substrate 300 where the doped regions 304 and the control gates 302 do not overlap. In addition, the floating gates 310 are disposed between the control gates 302 and the substrate 300, which is not covered by the isolation layer 306. The floating gates 310 can be, for example, polysilicon layers or other suitable conductive layers. The tunneling dielectric layers 312 are disposed between the substrate 300 and the floating gates 310. The inter-gate dielectric layers 314 are disposed between the control gates 302 and the floating gates 310. Wherein, the material of the inter-gate dielectric layer 314 can be, for example, oxide-nitride-oxide.

Additionally, the described strip-shape doped regions 304 may extend outwardly from the flash memory to be connected with the contacts outside of the memory. In some embodiments, the source/drain connection regions 316 are disposed in the structure shown in FIG. 3 to provide currents to each strip of the doped regions 304 which serve as sources and drains. The cross sectional views are shown as FIGS. 3 and 4-V, wherein FIG. 4-V is a cross sectional view of the FIG. 3 along V-V'.

Referring to FIGS. 3 and 4-V, the source/drain connection region 316 is disposed between two control gates 302. Additionally, the contact 320 connected with the doped region 304 in the source/drain connection region 316 is disposed within the dielectric layer 318 covering the substrate 300. The dielectric layer 318 described above usually is formed in the subsequent process. For example, the dielectric layer 318 can be, for example, an interlayer dielectric (ILD) layer.

Additionally, the described FIG. 4-IV can be presented by another structure, e.g., shown in FIG. 5-IV.

Referring to FIG. 5-IV, in order to enhance conductivity, a silicide layer 322 may be disposed on the top of the control gate 302 if the control gate 302 is a polysilicon layer. Additionally, the spacers 324 are disposed on the sidewalls of the control gate 310 and the floating gate 302.

Second Embodiment

Following are descriptions of the method of fabricating the flash memory. These descriptions are mere an embodiment of the present invention. The present invention, however, is not limited thereto. Moreover, main device references used in this embodiment represent that they are similar to those in the last embodiment.

FIGS. 6A-I-6D-I are cross sectional views of process of fabricating the structure of FIG. 3 along I-I'. FIGS. 6A-II-6E-II are cross sectional views of process of fabricating the structure of FIG. 3 along II-II'. FIGS. 6A-III-6E-III are cross sectional views of process of fabricating the structure of FIG. 3 along III-III'. FIGS. 6A-IV-6E-IV are cross sectional views of process of fabricating the structure of FIG. 3 along IV-IV'.

Referring to FIG. 6A-I-6A-IV, plural strips of trench isolation structures 608 with the first direction are formed within the substrate 300 as shown in FIG. 3. The tunneling dielectric layer 312 then is formed over the substrate 300. Plural strips of first conductive layers 610 are arranged over the tunneling dielectric layer 312 with the second direction as shown in FIG. 3. The first conductive layers 610 cross over the trench isolation structures 608. In this step, a polysilicon layer is deposited over the substrate 300, for example. A patterned silicon nitride layer then is formed over the polysilicon layer. By using the patterned silicon nitride layer as a mask, the exposed polysilicon layer is patterned and removed.

Referring to FIGS. 6B-I-6B-III, the tunneling dielectric layer 312 between the first conductive layers 610 is removed to expose a portion of the trench isolation structures 608. The exposed isolation structures 608 then are removed. At this moment, the remaining trench isolation structures are the isolation structures 308 of the first embodiment. The substrate 300 at the bottom of the removed trench isolation structures 608 is exposed. An ion implantation process 612 is performed to form a plurality of doped regions 304 within the exposed substrate 300 between the first conductive layers 610. For the processes described above, the cross sectional view of the structure in FIG. 3 along IV-IV' is similar to the structure shown in FIG. 6A-IV. What is different is that the isolation structures 308 replace the strip of the trench isolation structures 608 because portions of the strip of the trench isolation structures 608 have been removed.

Referring to FIG. 6C-I-6C-III, the isolation layer 306 is filled between the first conductive layers 610, exposing the top of the first conductive layers 610. According to the method of filling the isolation layer 306, a dielectric layer is formed over the substrate 300 by using a high-density plasma (HDP) process, for example. A chemical-mechanical polish (CMP) process removes the dielectric layer until exposing the top of the first conductive layers 610. In addition, if a patterned silicon nitride layer serves as a mask before the first conductive layers 610 are formed, the patterned silicon/nitride layer can be removed after the isolation layer 306 has been filled between the first conductive layers 610. In this step, the cross sectional view of the structure along IV-IV' in FIG. 3 is as same as the structure in FIG. 6A-IV.

Referring to FIGS. 6D-I-6D-IV, in order to enhance the gate coupling ratio (GCR), a portion of the HDP material layer 306 is removed first so that the top of the HDP material layer 306 is lower than the top of the first conductive layers 610. The inter-gate dielectric layer 314 is formed over the substrate 300, covering the first conductive layer 610. The step of forming the inter-gate dielectric layer 314 can be, for example, forming a oxide-nitride-oxide layer. The second conductive layer 602 is formed over the inter-gate dielectric layer 314. The second conductive material layer 602 can be a polysilicon layer, for example.

Referring to FIGS. 6E-II-6E-IV, the second conductive layer 602 is patterned to form plural strips of control gates 302 with the first direction. With the control gates 302 serving as a mask, the inter-gate dielectric layer 314 and the first conductive layers 610 thereunder are removed to form a plurality of floating gates 310. At this moment, the cross sectional view of the structure along I-I' in FIG. 3 is as same as the structure in FIG. 6D-I.

Additionally, the process of the present invention may include optional steps. For example, according to the structure of the first embodiment shown in FIG. 5-IV, the silicide layer 322 is formed on the control gate 302 to increase its conductivity after the floating gate 310 is formed. Moreover, the spacers 324 can be formed on the sidewalls of the control gates 302 and the floating gates 310.

In order to simplify the interpretation of the present invention, according to the structure of the first embodiment shown in FIG. 4-V, an interlayer dielectric (ILD) layer 318 over the substrate 300 can be disposed after the floating gates are formed. A contact 320, which connects with the doped region 304, is then formed within the ILD layer 318.

According to the present invention, the flash memory has the control gates and the doped regions, which are alternately disposed. As a result, the contact areas connected to the drain areas are reduced, and the whole array areas shrink as well. Additionally, signals can be transmitted with the same distance. In addition, the fabrication method of the present invention is compatible with the traditional process. Without additional processes, the flash memory of the present invention can be fabricated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory, comprising:
   a substrate;
   plural strips of control gates, arranged over the substrate with a first direction;
   plural strips of doped regions, arranged within the substrate with a second direction, each strip of doped region is across a multiple of the strips of control gates;
   an isolation layer, disposed on the doped region and between the control gates and the doped regions;
   a plurality of isolation structures, disposed within the substrate where the doped regions and the control gate do not overlap;
   a plurality of floating gates, disposed between the control gates and the substrate not covered by the isolation layer;
   a plurality of tunneling dielectric layers, disposed between the substrate and the floating gates; and
   a plurality of inter-gate dielectric layers, disposed between the control gates and the floating gates.

2. The flash memory of claim 1, further comprising:
   a plurality of source/drain connection regions, each of them being disposed between two control gates; and
   a plurality of contacts, each contact being connected with one of the doped regions within the source/drain connection regions.

3. The flash memory of claim 1, wherein the control gates and the floating gates comprise polysilicon layers.

4. The flash memory of claim 1, wherein a material of the inter-gate dielectric layers comprises oxide-nitride-oxide.

5. The flash memory of claim 1, wherein the isolation layer comprises a high-density plasma (HDP) material layer.

6. The flash memory of claim 1, further comprising a silicide layer disposed on tops of the control gates.

7. The flash memory of claim 1, further comprising a plurality of spacers disposed on sidewalls of the control gates and the floating gates.

* * * * *